United States Patent
Choi et al.

(10) Patent No.: US 10,002,893 B2
(45) Date of Patent: Jun. 19, 2018

(54) IMAGE SENSOR INCLUDING HYBRID PIXEL STRUCTURE

(71) Applicant: Samsung Electronics Co., Ltd., Suwon-si, Gyeonggi-do (KR)

(72) Inventors: Hyuk-soon Choi, Suwon-si (KR); Jung-woo Kim, Suwon-si (KR); Myoung-hoon Jung, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days. days.

(21) Appl. No.: 15/312,789

(22) PCT Filed: May 19, 2014

(86) PCT No.: PCT/KR2014/004444
§ 371 (c)(1),
(2) Date: Nov. 21, 2016

(87) PCT Pub. No.: WO2015/178509
PCT Pub. Date: Nov. 26, 2015

(65) Prior Publication Data
US 2017/0148831 A1    May 25, 2017

(51) Int. Cl.
*H01L 27/14* (2006.01)
*H01L 29/04* (2006.01)
(Continued)

(52) U.S. Cl.
CPC .. *H01L 27/14607* (2013.01); *H01L 27/14614* (2013.01); *H01L 27/14627* (2013.01); *H01L 27/14645* (2013.01); *H01L 27/14649* (2013.01)

(58) Field of Classification Search
CPC ............ H01L 27/146; H01L 27/14605; H01L 27/14621; H01L 27/14627;
(Continued)

(56) References Cited

U.S. PATENT DOCUMENTS

| 7,262,402 B2 | 8/2007 | Niclass et al. |
| 7,491,937 B2 | 2/2009 | Nakanishi et al. |

(Continued)

FOREIGN PATENT DOCUMENTS

| KR | 10-0858034 B1 | 9/2008 |
| KR | 10-2012-0029527 A | 3/2012 |
| WO | WO-02/49367 A2 | 6/2002 |

OTHER PUBLICATIONS

International Search Report PCT/ISA/210 for International Application No. PCT/KR2014/004444 dated Jan. 28, 2015.

(Continued)

*Primary Examiner* — Thanh Y Tran
(74) *Attorney, Agent, or Firm* — Harness, Dickey & Pierce, P.L.C.

(57) ABSTRACT

Provided is an image sensor having a hybrid pixel structure in which pixels that sense visible light and pixels that sense ultraviolet light or infrared light are arranged together. For example, the image sensor includes a plurality of first pixels and a plurality of second pixels that are different in size. A width of each of the plurality of second pixels in a horizontal direction is a first integer multiple of a width of each of the plurality of first pixels in the horizontal direction, and a width of each of the plurality of second pixels in a vertical direction is a second integer multiple of a width of each of the plurality of first pixels in the vertical direction. The image sensor enables the pixels sensing ultraviolet light or infrared light, which have different sizes from the pixels sensing visible light, to be efficiently arranged together with the pixels sensing visible light, on the same substrate.

18 Claims, 5 Drawing Sheets

(51) Int. Cl.
*H01L 29/15* (2006.01)
*H01L 31/036* (2006.01)
*H01L 27/146* (2006.01)

(58) Field of Classification Search
CPC ......... H01L 27/14636; H01L 27/14645; H01L 27/14641; H01L 27/14609; H01L 27/14603; H01L 27/14607; H01L 27/14649
See application file for complete search history.

(56) References Cited

U.S. PATENT DOCUMENTS

| | | | |
|---|---|---|---|
| 8,222,603 B2 | 7/2012 | Lee | |
| 2006/0192086 A1 | 8/2006 | Niclass et al. | |
| 2007/0145273 A1 | 6/2007 | Chang | |
| 2007/0284532 A1 | 12/2007 | Nakanishi et al. | |
| 2010/0245826 A1 | 9/2010 | Lee | |
| 2014/0152881 A1* | 6/2014 | Ishiwata | ........... H01L 27/14621 348/308 |
| 2015/0097108 A1* | 4/2015 | Bishay | .................. H04N 9/045 250/208.1 |

OTHER PUBLICATIONS

International Preliminary Report on Patentability dated Nov. 22, 2016 issued in corresponding International Application No. PCT/KR2014/004444 (with partial English translation).
International Search Report dated Jan. 28, 2015 issued in corresponding International Application No. PCT/KR2014/004444 (with English translation).

* cited by examiner

[Fig. 1]
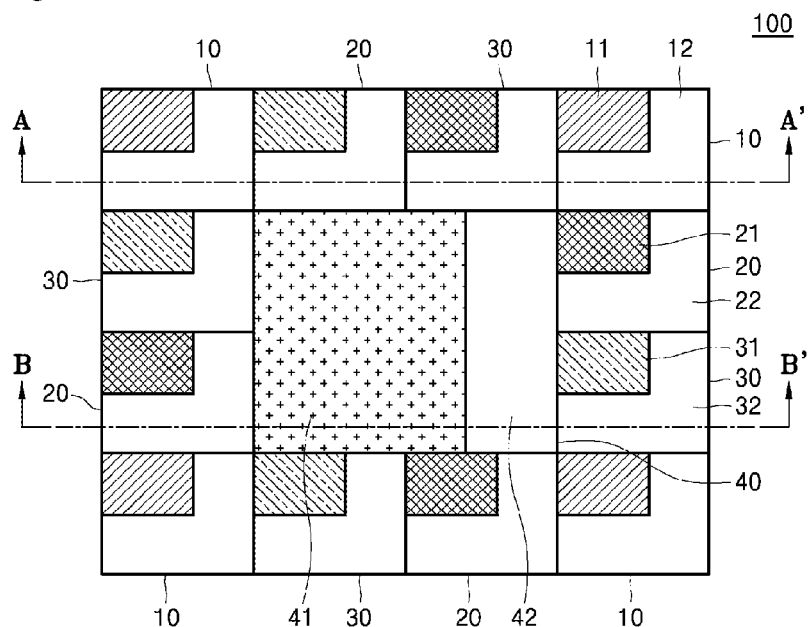
[Fig. 2a]
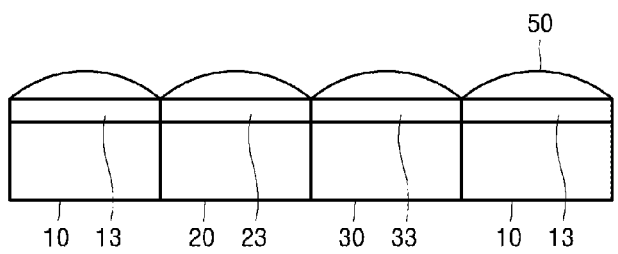
[Fig. 2b]
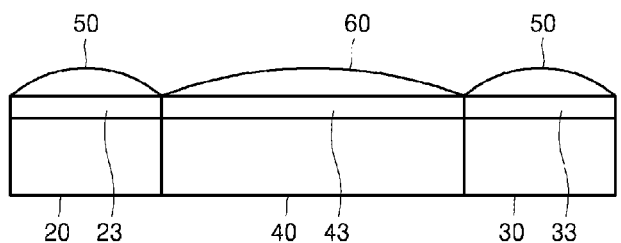

[Fig. 3]
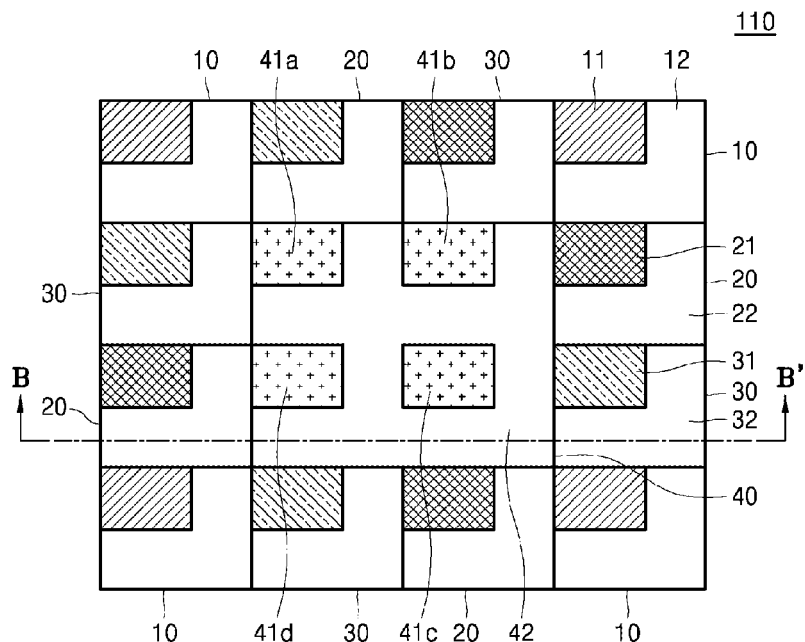
[Fig. 4]
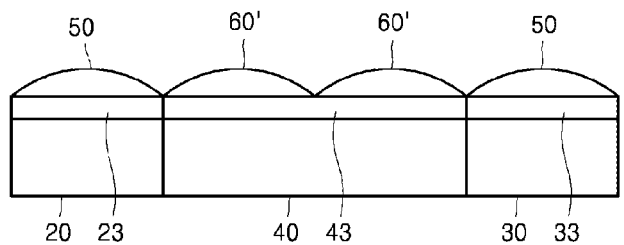
[Fig. 5]
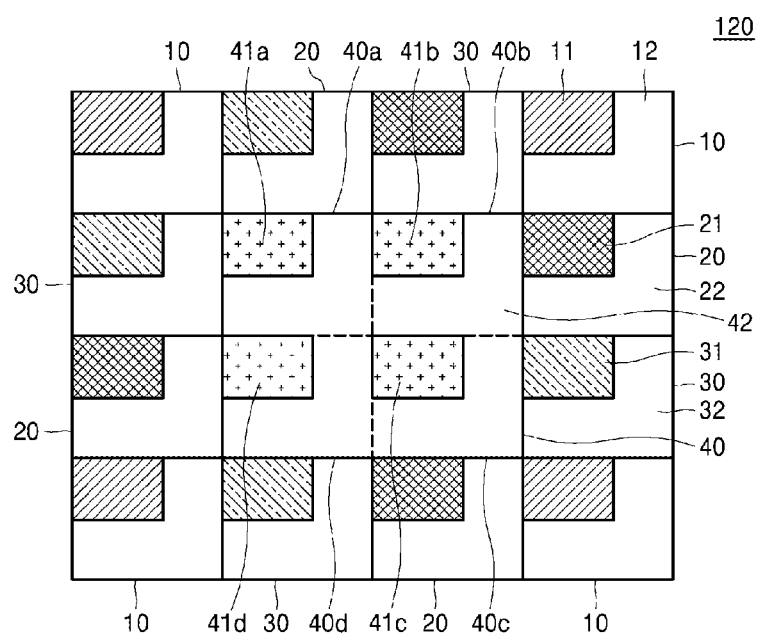

[Fig. 6]
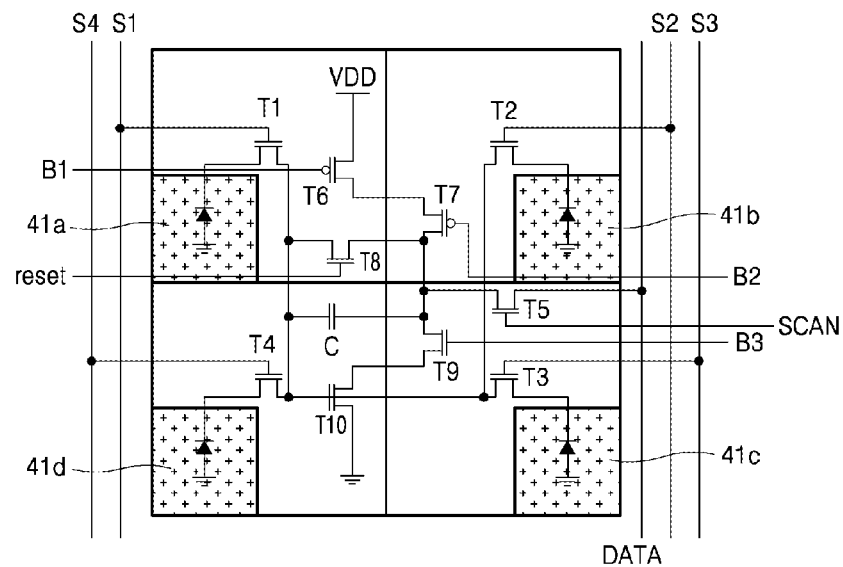
[Fig. 7]
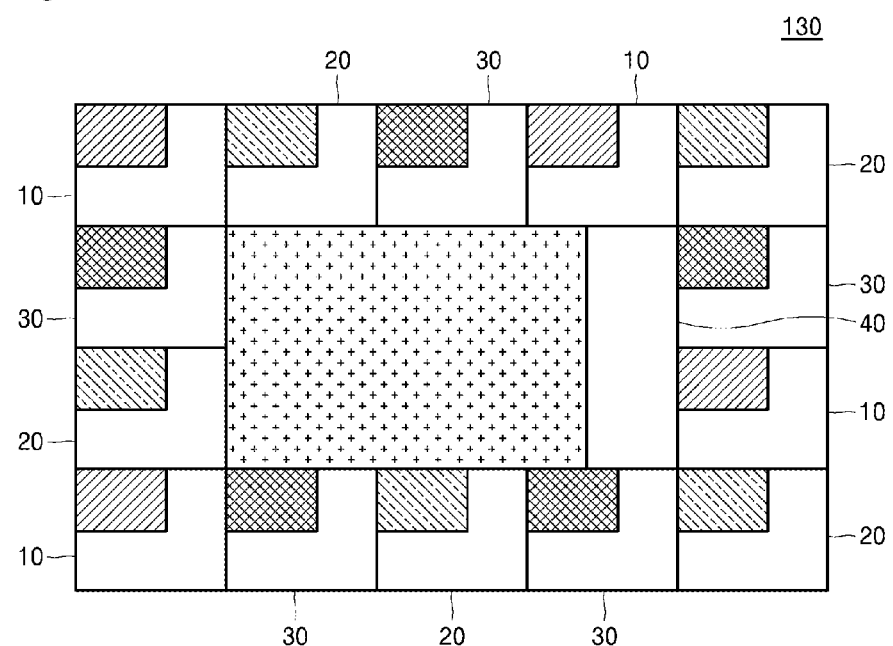

[Fig. 8]
| 10 | 20 | 30 | 10 | 20 |
|---|---|---|---|---|
| 30 | | | | 30 |
| 20 | | 40 | | 10 |
| 10 | 30 | 10 | 30 | 20 |
| 30 | 10 | 20 | 10 | 30 |
| 20 | | | | 20 |
| 10 | | 40 | | 10 |
| 30 | 20 | 10 | 30 | 20 |
—130a
—130b
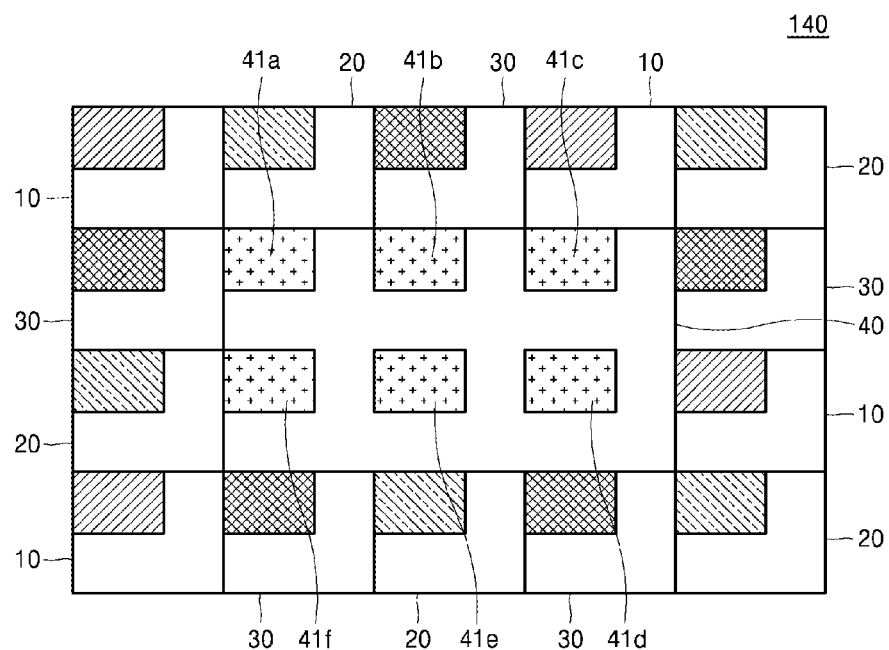
[Fig. 9]

[Fig. 10]
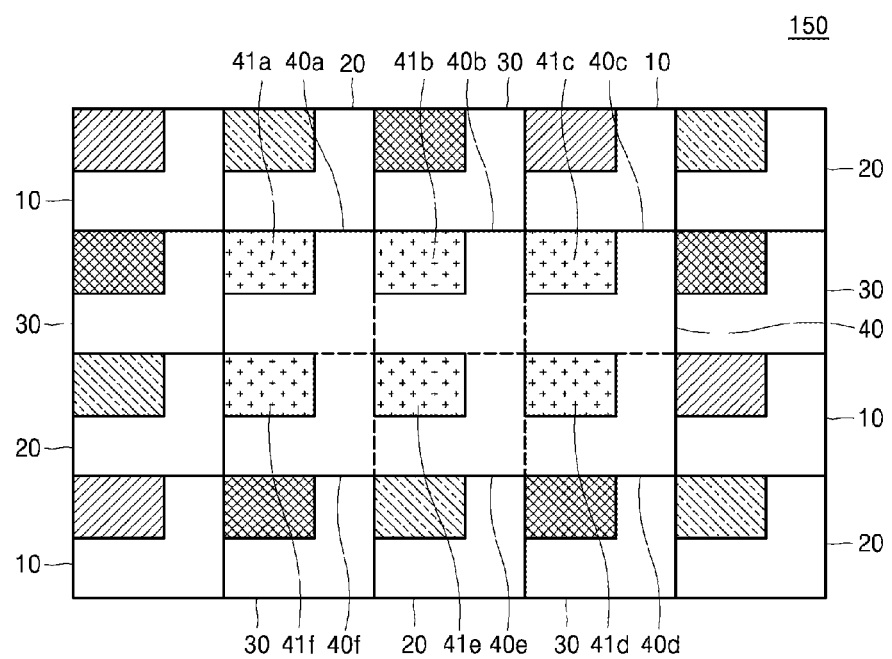

IMAGE SENSOR INCLUDING HYBRID PIXEL STRUCTURE

CROSS-REFERENCE TO RELATED APPLICATIONS

This application is the U.S. National Phase application of PCT Application No. PCT/KR2014/004444 filed on May 19, 2014, the entire contents of which are incorporated herein by reference.

TECHNICAL FIELD

The present invention relates to an image sensor having a hybrid pixel structure, and more particularly, to an image sensor having a hybrid pixel structure in which a pixel that senses visible light and a pixel that senses ultraviolet light or infrared light are arranged together.

BACKGROUND ART

Image sensors typically include an array of a plurality of pixels that sense a red color, a green color, and a blue color, in order to generate a color image. Color image sensors may include an array of pixels that sense a cyan color, a yellow color, a green color, and a magenta color, instead of pixels that sense a red color, a green color, and a blue color. These pixels are all configured to have a structure for sensing visible light, and separate and sense their corresponding colors by using only color filters. Accordingly, the plurality of pixels may include the same light sensing regions and the same driving circuits having the same materials and the same structures, and red, green, and blue pixels may be distinguished from one another by only color filters.

Recently, an image sensor additionally having various functions, such as night vision, thermal photography, and three-dimensional (3D) photography, is in demand, and there have been attempts to integrate a pixel for sensing infrared light or ultraviolet light into an image sensor. However, because an existing pixel structure that senses visible light has difficulty in sensing infrared light or ultraviolet light via only a replacement of color filters, pixels having a different structure from the existing pixel structure are additionally arranged to sense infrared light or ultraviolet light.

DETAILED DESCRIPTION OF THE INVENTION

Technical Problem

The present invention provides an image sensor having a hybrid pixel structure in which a pixel for sensing visible light and a pixel for sensing ultraviolet light or infrared light are arranged together.

Technical Solution

According to an aspect of the present invention, there is provided an image sensor including a plurality of first pixels and a plurality of second pixels that are different in size. A width of each of the plurality of second pixels in a horizontal direction is a first integer multiple of a width of each of the plurality of first pixels in the horizontal direction, a width of each of the plurality of second pixels in a vertical direction is a second integer multiple of a width of each of the plurality of first pixels in the vertical direction, at least one of the first and second integer multiples is greater than 1, and the plurality of first pixels are arranged around each of the plurality of second pixels.

Each of the plurality of first pixels may be configured to sense visible light and each of the plurality of second pixels may be configured to sense ultraviolet light or infrared light.

The plurality of first pixels may include a red pixel that senses red light, a green pixel that senses green light, and a blue pixel that senses blue light.

The red pixel, the green pixel and the blue pixel of the plurality of first pixels may be repeatedly arranged around the plurality of second pixels.

The pixel array may include a first pixel array and a second pixel array that are adjacent to each other. An order in which a red pixel, a green pixel, and a blue pixel of first pixels are arranged around a second pixel of the first pixel array may be different from an order in which a red pixel, a green pixel, and a blue pixel of first pixels are arranged around a second pixel of the second pixel array.

First pixels of the first pixel array and first pixels of the second pixel array that directly contact each other may sense different colors.

Each of the plurality of first pixels may include a first light sensing portion that generates light current in response to incident light, a first driving circuit unit that stores and outputs the light current, and a first micro lens that collects light on the first light sensing region. Each of the plurality of second pixels may include a second light sensing portion that generates light current in response to incident light, a second driving circuit unit that stores and outputs the light current, and a second micro lens that collects light on the second light sensing region.

A size of the second light sensing portion may be greater than a size of the first light sensing portion.

A size of the second micro lens may be greater than a size of the first micro lens to cover each of the plurality of second pixels.

The second light sensing portion of each of the plurality of second pixels may be split into a plurality of sub-regions.

The number of sub-regions into which the second light sensing portion is split may be equal to a product of the first integer multiple and the second integer multiple.

A size of each of the sub-regions into which the second light sensing portion is split may be equal to a size of the first light sensing portion.

A size of the second micro lens may be equal to a size of the first micro lens. As many second micro lenses as the number of sub-regions into which the second light sensing portion is split may be arranged within each of the plurality of second pixels.

The second driving circuit unit may be configured to collect and output light currents respectively generated by the plurality of sub-regions so that the plurality of sub-regions serve as a single light sensing portion.

The second driving circuit unit may be configured to individually output light currents respectively generated by the plurality of sub-regions so that the plurality of sub-regions serve as independent light sensing portions.

The second driving circuit unit may include a capacitor for storing light current, a plurality of thin film transistors (TFTs) that are switched on to transmit the light currents respectively generated by the plurality of sub-regions to the capacitor, and output circuits for outputting the light current stored in the capacitor. The plurality of TFTs may be connected to the plurality of sub-regions, respectively.

The plurality of TFTs may be connected between the plurality of sub-regions and the capacitor.

The plurality of sub-regions may share the capacitor and the output circuits.

The first and second light sensing portions may include at least one photosensitive material from among Si, Ge, GaAs, InGaAs, GaN, InSb, InP, and HgCdTe.

Advantageous Effects

In image sensors having hybrid pixel structures according to disclosed embodiments, different types of pixels having different sizes are effectively arranged, and thus pixels that sense visible light and pixels that sense ultraviolet light or infrared light are able to be arranged together on the same substrate. Accordingly, the image sensors having hybrid pixel structures according to disclosed embodiments are relatively easily manufactured, and the entire area of each image sensor may be efficiently used. These image sensors may provide various functions, such as, night vision, thermal photography, and three-dimensional (3D) photography, together with capturing of a color image.

DESCRIPTION OF THE DRAWINGS

FIG. 1 illustrates a unit pixel array having a hybrid pixel structure for an image sensor according to an embodiment.

FIG. 2A is a schematic cross-sectional view obtained by cutting the unit pixel array of FIG. 1 along line A-A'.

FIG. 2B is a schematic cross-sectional view obtained by cutting the unit pixel array of FIG. 1 along line B-B'.

FIG. 3 illustrates a unit pixel array having a hybrid pixel structure for an image sensor according to another embodiment.

FIG. 4 is a schematic cross-sectional view obtained by cutting the unit pixel array of FIG. 3 along line B-B'.

FIG. 5 illustrates a unit pixel array having a hybrid pixel structure for an image sensor according to another embodiment.

FIG. 6 is a circuit diagram of a circuit structure of a second driving circuit unit of each second pixel in the image sensor of FIG. 5.

FIG. 7 illustrates a unit pixel array having a hybrid pixel structure for an image sensor according to another embodiment.

FIG. 8 illustrates an arrangement of a plurality of pixel arrays of FIG. 7.

FIG. 9 illustrates a unit pixel array having a hybrid pixel structure for an image sensor according to another embodiment.

FIG. 10 illustrates a unit pixel array having a hybrid pixel structure for an image sensor according to another embodiment.

MODE OF THE INVENTION

An image sensor including a hybrid pixel structure will now be described in detail with reference to the accompanying drawings, in which exemplary embodiments of the invention are shown. Like reference numerals in the drawings denote like elements, and, in the drawings, the sizes of elements may be exaggerated for clarity and for convenience of explanation. In this regard, the present embodiments may have different forms and should not be construed as being limited to the descriptions set forth herein. It will be understood that when a layer is referred to as being "on" another layer or substrate, it can be directly on the other layer or substrate, or intervening layers may also be present.

FIG. 1 illustrates a unit pixel array 100 having a hybrid pixel structure for an image sensor according to an embodiment. The image sensor according to the present embodiment may include a pixel array including a plurality of first pixels 10, 20, and 30 and a plurality of second pixels 40. The first pixels 10, 20, and 30 have different sizes from the second pixels 40. FIG. 1 illustrates the unit pixel array 100 including a plurality of first pixels 10, 20, and 30 and a single second pixel 40.

Referring to FIG. 1, the second pixel 40 is larger than each of the first pixels 10, 20, and 30 and is arranged at the center of the unit pixel array 100, and the plurality of first pixels 10, 20, and 30 are arranged around the second pixel 40. In order for the plurality of first pixels 10, 20, and 30 to be accurately arranged around the second pixel 40 without gaps, the size of the second pixel 40 may be an integer multiple of the size of each of the first pixels 10, 20, and 30. In other words, a width of the second pixel 40 in a horizontal direction may be an integer multiple of a width of each of the first pixels 10, 20, and 30 in a horizontal direction, and a width of the second pixel 40 in a vertical direction may be an integer multiple of a width of each of the first pixels 10, 20, and 30 in a vertical direction. For example, as illustrated in FIG. 1, the size of the second pixel 40 may be (2×2) times the size of each of the first pixels 10, 20, and 30. Then, 12 first pixels 10, 20, and 30 may be arranged around the second pixel 40.

The first pixels 10, 20, and 30 may be configured in a typical pixel structure that senses visible light. For example, the first pixels 10, 20, and 30 may include red pixels 10 for sensing red light, green pixels 20 for sensing green light, and blue pixels 30 for sensing blue light. The red pixels 10, the green pixels 20, and the blue pixels 30 may be alternately arranged around the second pixel 40. The first pixels 10, 20, and 30 may include first light sensing portions 11, 21, and 31 for generating light current in response to visible light, respectively, and first driving circuit units 12, 22, and 32 for storing and outputting the light current, respectively. The first light sensing portions 11, 21, and 31 may include a photosensitive material, such as, Si, Ge, InGaAs, GaN, InSb, or InP, in order to sense light in a visible light range.

The second pixel 40 may also be configured to sense light in a range other than the visible light range, for example, ultraviolet light or infrared light. The second pixel 40 may include a second light sensing portion 41 generating light current in response to ultraviolet light or infrared light, and a second driving circuit unit 42 storing and outputting the light current. The second light sensing portion 42 may include a photosensitive material, such as, Si, Ge, GaAs, InGaAs, GaN, InSb, InP, or HgCdTe, in order to sense light in an ultraviolet or infrared light range.

In general, much bigger noise is generated when the infrared light or the ultraviolet light is sensed than when the visible light is sensed. Accordingly, to sufficiently remove noise, the second driving circuit unit 42 of the second pixel 40 has a more complicated circuit structure and a larger size than the first driving circuit units 12, 22, and 32 of the first pixels 10, 20, and 30, which sense visible light. For this reason, the second pixel 40 is bigger than each of the first pixels 10, 20, and 30, and, according to the present embodiment, the different types of pixels 10, 20, 30, and 40 having different sizes may be efficiently arranged due to the setting of the size of the second pixel 40 as the integer multiple of the size of each of the first pixels 10, 20, and 30. Accordingly, the first pixels 10, 20, and 30 sensing visible light and the second pixels 40 sensing ultraviolet light or infrared light may be arranged together on the same substrate. According to the present embodiment, an image sensor having such a hybrid pixel structure is relatively easily manufactured, and the entire area of the image sensor may be efficiently used. In addition, the image sensor having the hybrid pixel structure according to the present embodiment may provide various functions, such as, night vision, thermal photography, and three-dimensional (3D) photography, together with capturing of a color image.

FIG. 2A is a schematic cross-sectional view obtained by cutting the unit pixel array 100 of FIG. 1 along line A-A'. Referring to FIG. 2A, a red pixel 10, a green pixel 20, a blue pixel 30, and a red pixel 10 are sequentially arranged, and color filters 13, 23, and 33 transmitting only visible red, green, and blue lights, respectively, may be arranged on the red, green, and blue pixels 10, 20, and 30, respectively. A plurality of first micro lenses 50 for collecting lights on the first light sensing regions 11, 21, and 31, respectively, may be arranged on the color filters 13, 23, and 33. The plurality of first micro lenses 50 may be disposed on the red, green, and blue pixels 10, 20, and 30, respectively.

FIG. 2B is a schematic cross-sectional view obtained by cutting the unit pixel array 100 of FIG. 1 along line B-B'. Referring to FIG. 2B, the green pixel 20 and the blue pixel 30 may be arranged on both lateral surfaces of the second pixel 40, respectively. The color filters 23 and 33 transmitting only the visible green and blue lights may be arranged on the green pixel 20 and the blue pixel 30, and a band pass filter 43 transmitting only ultraviolet light or infrared light in a desired wavelength band may be arranged on the second pixel 40. First micro lenses 50 may be arranged on the color filters 23 and 33, and a second micro lens 60 collecting light on the second light sensing region 41 may be arranged on the band pass filter 43. As illustrated in FIG. 2B, the second micro lens 60 may be larger than each first micro lens 50 in order to cover the second pixel 40. For example, a ratio between the sizes of the second micro lens 60 and each first micro lens 50 may be equal to a ratio between the sizes of the second pixel 40 and each of the first pixels 10, 20, and 30.

FIG. 3 illustrates a unit pixel array 110 having a hybrid pixel structure for an image sensor according to another embodiment. In the embodiment of FIG. 1, the second light sensing portion 41 of the second pixel 40 is larger than each of the first light sensing portions 11, 21, and 31 of the first pixels 10, 20, and 30, and thus the second micro lens 60 is also larger than each first micro lens 50. In this case, a plurality of micro lenses 50 and 60 having different sizes are required, and thus it may be difficult to manufacture a micro lens array.

In the embodiment of FIG. 3, the second light sensing portion 41 within the second pixel 40 may be split into a plurality of sub-regions 41a, 41b, 41c, and 41d. For example, in FIG. 3, the second light sensing portion 41 is split into the four sub-regions 41a, 41b, 41c, and 41d. The number of sub-regions 41a, 41b, 41c, and 41d may be equal to the product of a ratio between the widths of the second pixel 40 and each of the first pixels 10, 20, and 30 in a horizontal direction and a ratio between the widths of the second pixel 40 and each of the first pixels 10, 20, and 30 in a vertical direction. As illustrated in FIG. 3, when the second pixel 40 is (2×2) times larger than each of the first pixels 10, 20, and 30, the second light sensing portion 41 within the second pixel 40 may be split into the four sub-regions 41a, 41b, 41c, and 41d. In this case, the size of each of the sub-regions 41a, 41b, 41c, and 41d of the second light sensing portion 41 may be equal to that of each of the first light sensing portions 11, 21, and 31.

FIG. 4 is a schematic cross-sectional view obtained by cutting the unit pixel array 110 of FIG. 3 along line B-B'. Referring to FIG. 4, a plurality of second micro lenses 60' may be arranged to respectively cover the sub-regions 41a, 41b, 41c, and 41d. In other words, the number of second micro lenses 60' included in the second pixel 40 may be equal to that of sub-regions 41a, 41b, 41c, and 41d. In this case, the size of the second micro lens 60' may be equal to that of each first micro lens 50. Accordingly, it may be easy to manufacture a micro lens array.

In the embodiment of FIG. 3, the second light sensing portion 41 is split into the plurality of sub-regions 41a, 41b, 41c, and 41d, but the second pixel 40 itself is not split. In other words, the second driving circuit unit 42 of the second pixel 40 is not split. In this case, in order for the plurality of sub-regions 41a, 41b, 41c, and 41d to serve as a single light sensing portion, the second driving circuit unit 42 may be configured to collect and output light currents respectively generated by the sub-regions 41a, 41b, 41c, and 41d.

FIG. 5 illustrates a unit pixel array 120 having a hybrid pixel structure for an image sensor according to another embodiment. In the embodiments of FIGS. 1 and 3, because the number of second pixels 40 having greater sizes is much less than that of first pixels 10, 20, and 30 having smaller sizes, the resolution of an infrared light image or an ultraviolet light image may be greatly lower than the resolution of a visible light image. In the embodiment of FIG. 5, to improve the resolution of the infrared light image or the ultraviolet light image, the second pixel 40 may be divided into a plurality of sub-pixels 40a, 40b, 40c, and 40d. In other words, the plurality of sub-regions 41a, 41b, 41c, and 41d may serve as independent light sensing portions, respectively. In order for each of the plurality of sub-regions 41a, 41b, 41c, and 41d to serve as an independent light sensing portion, the second driving circuit unit 42 of the second pixel 40 may be configured to individually output the light currents respectively generated by the sub-regions 41a, 41b, 41c, and 41d.

FIG. 6 is a circuit diagram of a circuit structure of the second driving circuit unit 42 in order to individually output the light currents respectively generated by the sub-regions 41a, 41b, 41c, and 41d. Referring to FIG. 6, the second driving circuit unit 42 may include a capacitor C for storing light current, a plurality of thin film transistors (TFTs) T1, T2, T3, and T4 that are switched on to transmit the light currents respectively generated by the sub-regions 41a, 41b, 41c, and 41d to the capacitor C, and output circuits T5-T10 for amplifying and outputting the light current stored in the capacitor C. The plurality of TFTs T1, T2, T3, and T4 are connected between the sub-region 41a and the capacitor C, between the sub-region 41b and the capacitor C, between the sub-region 41c and the capacitor C, and between the sub-region 41d and the capacitor C, respectively. Selection lines S1, S2, S3, and S4 are connected to gates of the TFTs T1, T2, T3, and T4, respectively.

In this structure, when a first TFT T1 is turned on via a first selection line S1, the light current generated by the first sub-region 41a may be stored in the capacitor C. Thereafter, when an output transistor T5 is turned on via a scan line SCAN, the light current stored in the capacitor C may be output via a data line DATA. Then, a reset transistor T8 is turned on via a reset line and initializes the capacitor C, and a second TFT T2 is turned on via a second selection line S2 and stores the light current generated by the second sub-region 41b in the capacitor C. According to this method, the circuit structure may independently output the light currents respectively generated by the plurality of sub-regions 41a, 41b, 41c, and 41d.

As illustrated in FIG. 6, the sub-regions 41a, 41b, 41c, and 41d may share a remaining circuit structure except for the TFTs T1, T2, T3, and T4 respectively connected to the sub-regions 41a, 41b, 41c, and 41d, namely, may share the capacitor C and the output circuits T5-T10. Accordingly, as compared with the case where an independent driving circuit is disposed on each of the sub-regions 41a, 41b, 41c, and 41d, the area of the second driving circuit unit 42 may be saved. Thus, while the entire area of the second pixel 40 is kept as it is, the resolution of an infrared light image or an ultraviolet light image may improve.

FIG. 7 illustrates a unit pixel array 130 having a hybrid pixel structure for an image sensor according to another embodiment. As compared with the unit pixel array 100 of FIG. 1, the unit pixel array 130 of FIG. 7 includes a second pixel 40 which is (2×3) times larger than each of the first pixels 10, 20, and 30. In this case, 14 first pixels 10, 20, and 30 may be arranged around the second pixel 40. Although the second pixel 40 of FIG. 1 and the second pixel 40 of FIG. 7 are illustrated as being (2×2) times and (2×3) times larger than each of the first pixels 10, 20, and 30, respectively, they are merely examples. For example, when the width of the second pixel 40 in a horizontal direction is greater than that of each of the first pixels 10, 20, and 30 in a horizontal direction by a first integer multiple and the width of the second pixel 40 in a vertical direction is greater than that of each of the first pixels 10, 20, and 30 in a vertical direction by a second integer multiple, the size of the second pixel 40 may be selected so that at least one of the first integer multiple and the second integer multiple is greater than 1.

In the embodiment of FIG. 7, since the number of first pixels 10, 20, and 30 arranged around the second pixel 40 is 14, the number of red pixels 10, the number of green pixels 20, and the number of blue pixels 30 may be inconsistent with one another. Accordingly, to make all of the number of red pixels 10, the number of green pixels 20, and the number of blue pixels 30 in the image sensor be consistent with one another, a plurality of unit pixel arrays 130 having different arrangement orders of the first pixels 10, 20, and 30 may be used.

For example, referring to FIG. 8, the image sensor may include a first pixel array 130a and a second pixel array 130b arranged adjacent to each other. The order in which the red, green, and blue pixels 10, 20, and 30 of the first pixels 10, 20, and 30 are arranged around the second pixel 40 of the first pixel array 130a may be different from the order in which the red, green, and blue pixels 10, 20, and 30 of the first pixels 10, 20, and 30 are arranged around the second pixel 40 of the second pixel array 130b. By using the plurality of unit pixel arrays 130a and 130b having different arrangement orders of the red, green, and blue pixels 10, 20, and 30 in this way, the number of red pixels 10, the number of green pixels 20, and the number of blue pixels 30 in the image sensor may be consistent with one another.

The first pixels 10, 20, and 30 of the first pixel array 130a and the first pixels 10, 20, and 30 of the second pixel array 130b, which contact each other between the second pixel 40 of the first pixel array 130a and the second pixel 40 of the second pixel array 130b, may be arranged to sense different colors. For example, as illustrated in FIG. 8, red, blue, green, blue, and red pixels 10, 30, 10, 30, and 20 of the first pixel array 130a may contact blue, red, green, red, and blue pixels 30, 10, 20, 10, and 30 of the second pixel array 130b, respectively.

FIG. 9 illustrates a unit pixel array 140 having a hybrid pixel structure for an image sensor according to another embodiment. In the unit pixel array 140 of FIG. 9, similar to the unit pixel array 110 of FIG. 3, the second light sensing portion 41 within the second pixel 40 may be split into a plurality of sub-regions 41a, 41b, 41c, 41d, 41e, and 41f. Because the second pixel 40 is (2×3) times larger than each of the first pixels 10, 20, and 30, the second light sensing portion 41 of the unit pixel array 140 may be split into the six sub-regions 41a, 41b, 41c, 41d, 41e, and 41f. Similar to the embodiment of FIG. 3, in order for the plurality of sub-regions 41a, 41b, 41c, 41d, 41e, and 41f to serve as a single light sensing portion, the second driving circuit unit 42 may be configured to collect and output light currents respectively generated by the sub-regions 41a, 41b, 41c, 41d, 41e, and 41f.

FIG. 10 illustrates a unit pixel array 150 having a hybrid pixel structure for an image sensor according to another embodiment. In the unit pixel array 150 of FIG. 10, similar to the unit pixel array 120 of FIG. 5, each of the plurality of sub-regions 41a, 41b, 41c, 41d, 41e, and 41f may serve as an independent light sensing portion. To this end, the second driving circuit unit 42 of the second pixel 40 may be configured to individually output the light currents respectively generated by the sub-regions 41a, 41b, 41c, 41d, 41e, and 41f. The second driving circuit unit 42 may have a circuit structure that is almost the same as the circuit structure of FIG. 6, and only the number of TFTs disposed between the sub-regions 41a, 41b, 41c, 41d, 41e, and 41f and a capacitor and the number of selection lines are each increased from four to six.

An image sensor including a hybrid pixel structure according to one or more exemplary embodiments of the present invention have been described and illustrated in the accompanying drawings. It should be understood that the exemplary embodiments described therein should be considered in a descriptive sense only and not for purposes of limitation. Descriptions of features or aspects within each embodiment should typically be considered as available for other similar features or aspects in other embodiments.

The invention claimed is:

1. An image sensor comprising a plurality of first pixels and a plurality of second pixels that are different in size, wherein
   a width of each of the plurality of second pixels in a horizontal direction is a first integer multiple of a width of each of the plurality of first pixels in the horizontal direction,
   a width of each of the plurality of second pixels in a vertical direction is a second integer multiple of a width of each of the plurality of first pixels in the vertical direction,
   at least one of the first and second integer multiples is greater than 1, and
   the plurality of first pixels are arranged around each of the plurality of second pixels,
   wherein each of the plurality of second pixels comprises a second light sensing portion that generates light current in response to incident light, a second driving circuit unit that stores and outputs the light current, and a second micro lens that collects light on the second light sensing region,
   wherein the second light sensing portion of each of the plurality of second pixels is split into a plurality of sub-regions.

2. The image sensor of claim 1, wherein each of the plurality of first pixels is configured to sense visible light and each of the plurality of second pixels is configured to sense ultraviolet light or infrared light.

3. The image sensor of claim 2, wherein the plurality of first pixels comprise a red pixel that senses red light, a green pixel that senses green light, and a blue pixel that senses blue light.

4. The image sensor of claim 3, wherein the red pixel, the green pixel and the blue pixel of the plurality of first pixels are repeatedly arranged around the plurality of second pixels.

5. The image sensor of claim 4, wherein
the pixel array comprises a first pixel array and a second pixel array that are adjacent to each other, and
an order in which a red pixel, a green pixel, and a blue pixel of first pixels are arranged around a second pixel of the first pixel array is different from an order in which a red pixel, a green pixel, and a blue pixel of first pixels are arranged around a second pixel of the second pixel array.

6. The image sensor of claim 5, wherein first pixels of the first pixel array and first pixels of the second pixel array that directly contact each other sense different colors.

7. The image sensor of claim 1, wherein the second driving circuit unit is configured to collect and output light currents respectively generated by the plurality of sub-regions so that the plurality of sub-regions serve as a single light sensing portion.

8. The image sensor of claim 1, wherein the second driving circuit unit is configured to individually output light currents respectively generated by the plurality of sub-regions so that the plurality of sub-regions serve as independent light sensing portions.

9. The image sensor of claim 8, wherein the second driving circuit unit comprises a capacitor for storing light current, a plurality of thin film transistors (TFTs) that are switched on to transmit the light currents respectively generated by the plurality of sub-regions to the capacitor, and output circuits for outputting the light current stored in the capacitor, and the plurality of TFTs are connected to the plurality of sub-regions, respectively.

10. The image sensor of claim 9, wherein the plurality of TFTs are connected between the plurality of sub-regions and the capacitor.

11. The image sensor of claim 9, wherein the plurality of sub-regions share the capacitor and the output circuits.

12. The image sensor of claim 1, wherein the first and second light sensing portions comprise at least one photosensitive material from among Si, Ge, GaAs, InGaAs, GaN, InSb, InP, and HgCdTe.

13. The image sensor of claim 1, wherein each of the plurality of first pixels comprises a first light sensing portion that generates light current in response to incident light, a first driving circuit unit that stores and outputs the light current, and a first micro lens that collects light on the first light sensing region.

14. The image sensor of claim 13, wherein a size of the second light sensing portion is greater than a size of the first light sensing portion.

15. The image sensor of claim 14, wherein a size of the second micro lens is greater than a size of the first micro lens to cover each of the plurality of second pixels.

16. The image sensor of claim 13, wherein the number of sub-regions into which the second light sensing portion is split is equal to a product of the first integer multiple and the second integer multiple.

17. The image sensor of claim 16, wherein a size of each of the sub-regions into which the second light sensing portion is split is equal to a size of the first light sensing portion.

18. The image sensor of claim 16, wherein a size of the second micro lens is equal to a size of the first micro lens, and as many second micro lenses as the number of sub-regions into which the second light sensing portion is split are arranged within each of the plurality of second pixels.

* * * * *